FREQUENCY-MODULATED OSCILLATOR WITH AUTOMATIC FREQUENCY CORRECTION
Filed March 23, 1951
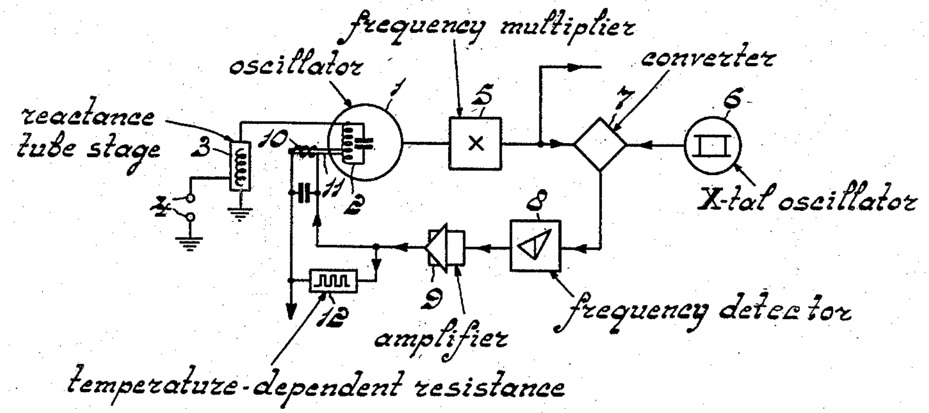
INVENTOR
Johannes Marinus Van Hofweegen
By
AGENT

United States Patent Office 2,768,293

Patented Oct. 23, 1956

2,768,293

FREQUENCY-MODULATED OSCILLATOR WITH AUTOMATIC FREQUENCY CORRECTION

Johannes Marinus van Hofweegen, Eindhoven, Netherlands, assignor to Hartford National Bank and Trust Company, Hartford, Conn., as trustee Application March 23, 1951, Serial No. 217,181

Claims priority, application Netherlands April 11, 1950

1 Claim. (Cl. 250—36)

The invention relates to a circuit-arrangement comprising a frequency-modulated oscillator, a device coupled with this oscillator to produce a control-voltage or current which is a measure of the frequency drift of the said oscillator, and a coupling (control-coupling) between the output of this device and a frequency-governing element of the oscillator to provide automatic frequency control (A. F. C.) of the oscillator.

It is found that in such a circuit-arrangement frequency correction can only occur if the oscillator frequency does not vary more than a predetermined amount from the desired frequency. The range of oscillator frequency variation over which correction is effective is referred to as the catching range of the A. F. C. circuit. As a rule, this catching range becomes narrower according as the control factor, i. e. the extent of suppression of an unwanted frequency drift, is increased. Thus, in frequency-modulated oscillators with slightly varying central frequency and hence with a high control factor, the frequency drift of the oscillator caused by temperature variations may readily cause the oscillator frequency to fall outside the catching range of the control.

The object of the invention is to provide a circuit-arrangement of the aforesaid kind, in which the frequency drift of the oscillator caused by ambient temperature variations in the vicinity of the oscillator is kept small enough so that the oscillator frequency always remains within the catching range of the frequency control. The ambient temperature variations may be caused by heat produced by the oscillator, or by other means.

According to the invention, the voltage or current fed to the frequency-governing element of the oscillator comprises essentially a component not varying with the frequency drift of the oscillator and the said control-coupling comprises a resistance varying with temperature, so that upon ambient temperature variations the oscillator frequency invariably remains within the catching range of the automatic frequency control.

In order to reduce the frequency drift of an oscillator due to temperature variations, it is known to arrange for the regenerative feedback circuit of the oscillator to include elements varying with temperature, whereby the frequency drift is reduced. However, in practice this method can only be carried out with difficulty when the oscillator is frequency-modulated, since the temperature-dependent element adversely affects the modulation characteristic curve.

An oscillator circuit with automatic frequency correction is also known, in which use is made of a frequency detector including a discriminating network comprising temperature-dependent tuned circuits such that the control voltage produced upon temperature variations is exactly high enough to compensate for the oscillator frequency drift. However, with this circuit-arrangement, the risk that the oscillator frequency may fall outside the catching range of the frequency control in the case of a high control-voltage is increased rather than decreased and furthermore it is difficult for the frequency detector to follow the prescribed variation with temperature with sufficient accuracy.

A temperature dependent element might be included in the output of the frequency detector, but this element could act only if the frequency detector should furnish a given control-voltage, so that a given frequency divergence from the desired frequency must already exist.

According to the invention, an essential component of the voltage or current fed to the frequency-governing element of the oscillator is independent of the frequency divergence of the oscillator. It is possible to produce the required additional control-voltage with the use of a temperature-dependent resistance, the resistance of which varies in accordance with changes in ambient temperature, in order to keep the oscillator invariably within the catching range of the frequency control in the event of temperature variations.

In order that the invention may be more clearly understood and readily carried into effect, it will now be described more fully with reference to the accompanying drawing, in which a circuit diagram is shown.

Referring to the single Figure of the drawing, 1 designates a frequency-modulated oscillator comprising a frequency-governing oscillatory circuit 2, with which is connected in parallel a reactance tube stage 3, the apparent reactance of which is varied in accordance with a modulating oscillation fed to the reactance tube stage 3 across the terminals 4. The frequency-modulated oscillations thus produced by the oscillator 1 are each converted with the use of a frequency multiplier 5 into a frequency-modulated oscillation to be emitted having a high central frequency and a great frequency sweep.

In order to stabilize the central frequency of this oscillation, this oscillation is mixed with the oscillation produced by a stable oscillator 6 in a mixer 7, so that an oscillation of low central frequency is obtained. With the use of a frequency detector 8 this oscillation is demodulated and this results in a control-voltage for the control of the frequency produced by the oscillator 1.

It is now found that with a sensitive control-circuit the frequency drift of the oscillator 1 due to ambient temperature variations will fall outside the catching range of the control-circuit. The control-circuit continues to be effective outside of the catching range, since the so-called "holding range" of the control-circuit is larger than the catching range, but if the control were temporarily made ineffective due to some disturbance, further control of the oscillator frequency would be prevented unless its frequency would again fall within the catching range of the control.

According to the invention, the control-voltage supplied by the frequency detector is converted, with the use of an amplifier 9, into a control-current. A portion of this control current passes through a winding 10 with the result that a ferro-magnetic core 11 of the inductance of the frequency-governing circuit 2 of the oscillator 1 is premagnetized. The remainder of the control current is supplied through a resistance 12 of negative temperature coefficient, for example a so-called "NTC" resistor.

The premagnetizing current passing through the winding 10 thus consists of a component varying with the frequency drift of the oscillator 1 and a component not varying therewith but, owing to the temperature-dependent resistance 12, varying to a considerable extent with ambient temperature.

The circuit-arrangement is adjusted so that, when the oscillator is operative for a long period, the oscillator frequency diverges as little as possible from the required value. When the oscillator has just started to operate, and hence its temperature is still comparatively low, it is found that if the resistance 12 should not vary with ambient temperature, the oscillator frequency is in general lower than this required value, the difference being such that this frequency would fall outside of the catching range of the control-circuit. However, since the resistance 12 with negative temperature coefficient has a higher value at this low temperature, more current passes through the premagnetizing winding 10, the inductance of the circuit 2 is lower and thus the frequency of the oscillator 1 is raised to a point where it remains within the catching range of the frequency control.

What I claim is:

Apparatus for stabilizing the mean frequency of a frequency-modulated oscillator subject to variation due to temperature changes, said oscillator being provided with a frequency-determining resonant circuit, said apparatus comprising means including a demodulator adapted to be coupled to the oscillator to derive therefrom a control signal dependent on the extent of drift of the oscillator frequency from the mean value, a signal-responsive frequency control device including a ferromagnetic core adapted to be inserted in said resonant circuit and a winding surrounding the core, means coupled to the output of said demodulator means and including a temperature dependent resistance to obtain from the control signal a first component which depends on said frequency drift and a second component which depends on temperature change and is independent of said frequency drift, and means to apply said first and second signal components to said winding to vary the permeability of said core and thereby the frequency of said oscillator in a direction and to an extent stabilizing said oscillator.

References Cited in the file of this patent

UNITED STATES PATENTS

| | | |
|---|---|---|
| 2,100,412 | Scott | Nov. 30, 1937 |
| 2,231,389 | Koffyberg | Feb. 11, 1941 |
| 2,233,198 | Dome | Feb. 25, 1941 |
| 2,235,019 | Johannson | Mar. 18, 1941 |
| 2,280,527 | Kimball | Apr. 21, 1942 |
| 2,285,016 | Carlisle | June 2, 1942 |
| 2,406,125 | Ziegler et al. | Aug. 20, 1946 |
| 2,452,575 | Kenny | Nov. 2, 1948 |
| 2,454,265 | Jaynes | Nov. 16, 1948 |
| 2,456,763 | Ziegler | Dec. 21, 1948 |
| 2,600,288 | Zylstra | June 10, 1952 |